United States Patent
Lin et al.

(10) Patent No.: US 8,222,064 B2
(45) Date of Patent: Jul. 17, 2012

(54) VERTICAL LIGHT EMITTING DIODE DEVICE STRUCTURE AND METHOD OF FABRICATING THE SAME

(75) Inventors: Limin Lin, Hong Kong (HK);
Xiangfeng Shao, Shenzhen (CN)

(73) Assignee: Hong Kong Applied Science and Technology Research Institute Company Limited, Hong Kong Science Park, Shatin, New Territories, Hong Kong (CN)

( * ) Notice: Subject to any disclaimer, the term of this patent is extended or adjusted under 35 U.S.C. 154(b) by 0 days.

(21) Appl. No.: 13/192,444

(22) Filed: Jul. 27, 2011

(65) Prior Publication Data

US 2011/0284906 A1    Nov. 24, 2011

Related U.S. Application Data

(63) Continuation-in-part of application No. 12/912,727, filed on Oct. 26, 2010, now Pat. No. 8,187,900, which is a continuation-in-part of application No. 12/058,059, filed on Mar. 28, 2008, now Pat. No. 7,846,753, and a continuation-in-part of application No. 12/415,467, filed on Mar. 31, 2009, now Pat. No. 7,985,971, and a continuation-in-part of application No. 11/891,466, filed on Aug. 10, 2007.

(60) Provisional application No. 61/445,516, filed on Feb. 22, 2011.

(51) Int. Cl.
*H01L 21/00* (2006.01)
*H01L 21/46* (2006.01)
*H01L 21/30* (2006.01)
*H01L 29/18* (2006.01)
*H01L 27/15* (2006.01)
*H01L 33/00* (2010.01)

(52) U.S. Cl. ............ 438/46; 438/38; 438/458; 438/455; 438/26

(58) Field of Classification Search ............ 438/38, 438/46, 455, 458; 257/79, 88, E33.075, E33.056
See application file for complete search history.

(56) References Cited

U.S. PATENT DOCUMENTS 5,332,467 A    7/1994    Sune
(Continued)

FOREIGN PATENT DOCUMENTS

CN    1510765 A    7/2004
(Continued)

OTHER PUBLICATIONS

International Search Report issued Jan. 7, 2010 in related application PCT/CN2009/071047.
(Continued)

*Primary Examiner* — Luan C Thai
(74) *Attorney, Agent, or Firm* — Ella Cheong Hong Kong; Margaret A. Burke; Sam T. Yip

(57) ABSTRACT

A method of fabricating a compound semiconductor vertical LED is provided. A first growth substrate capable of supporting compound semiconductor epitaxial growth thereon is provided. One or more epitaxial layers of compound semiconductor material such as GaN or InGaN is formed on the first growth substrate to create a portion of a vertical light emitting diode. Plural trenches are formed in the compound semiconductor material. Passivating material is deposited in one or more trenches. A hard material is at least partially deposited in the trenches and optionally on portions of the compound semiconductor material. The hard material has a hardness greater than the hardness of the compound semiconductor. A metal layer is deposited over the compound semiconductor material followed by metal planarization. A new host substrate is bonded to the metal layer and the first growth substrate is removed. Dicing is used to form individual LED devices.

18 Claims, 7 Drawing Sheets

U.S. PATENT DOCUMENTS

| | | | |
|---|---|---|---|
| 5,977,565 | A | 11/1999 | Ishikawa |
| 6,455,340 | B1 | 9/2002 | Chua |
| 7,001,824 | B2 | 2/2006 | Hon |
| 7,015,117 | B2 | 3/2006 | Urbanek |
| 7,125,741 | B2 | 10/2006 | Yen |
| 7,501,299 | B2 | 3/2009 | Wong |
| 7,535,100 | B2 | 5/2009 | Kub |
| 7,573,076 | B2 | 8/2009 | Baik |
| 2004/0115849 | A1 | 6/2004 | Iwafuchi |
| 2005/0009345 | A1 | 1/2005 | Yen |
| 2006/0154393 | A1* | 7/2006 | Doan et al. .............. 438/26 |
| 2006/0255341 | A1 | 11/2006 | Pinnington |
| 2007/0126022 | A1 | 6/2007 | Baik |
| 2007/0231963 | A1* | 10/2007 | Doan et al. .............. 438/107 |
| 2008/0197367 | A1 | 8/2008 | Cai |
| 2009/0039383 | A1 | 2/2009 | Chu |
| 2009/0218590 | A1 | 9/2009 | Cai |

FOREIGN PATENT DOCUMENTS

| | | |
|---|---|---|
| JP | 2007-158334 A | 6/2007 |
| WO | WO-2009/021416 A | 2/2009 |

OTHER PUBLICATIONS

International Search Report in related U.S. Appl. No. 12/058,059.

* cited by examiner

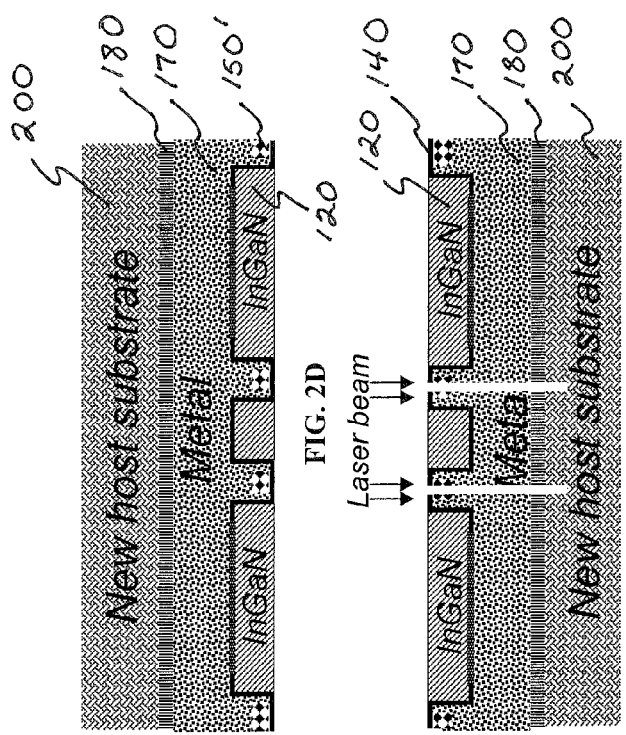
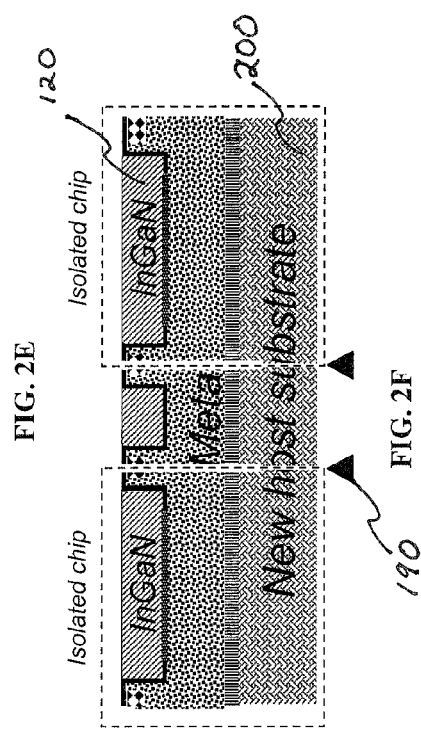
FIG. 2D
FIG. 2E
FIG. 2F

VERTICAL LIGHT EMITTING DIODE DEVICE STRUCTURE AND METHOD OF FABRICATING THE SAME

CROSS-REFERENCE TO RELATED APPLICATIONS

This application is a continuation-in-part of U.S. Provisional Patent Application 61/445,516 filed Feb. 22, 2011 and U.S. patent application Ser. No. 12/912,727, filed Oct. 26, 2010, U.S. patent application Ser. No. 11/891,466, filed Aug. 10, 2007, U.S. patent application Ser. No. 12/058,059 filed Mar. 22, 2008 now U.S. Pat. No. 7,846,753, and U.S. patent application Ser. No. 12/415,467 filed Mar. 31, 2009, all of the disclosures of which are incorporated by reference herein.

FIELD OF INVENTION

The present invention relates to LED fabrication and, more particularly, vertical LED fabrication and LED devices formed thereby.

BACKGROUND

Vertical light-emitting diodes (LEDs) including GaN-based material have become increasingly popular as light sources. Typically, epitaxial material layers including GaN are deposited on non-GaN substrates such as sapphire ($Al_2O_3$), due to the low-cost availability of high quality sapphire substrates. However, high-power GaN-based LEDs generate considerable thermal energy during use; this thermal energy requires effective dissipation to enable use of large-size LED sources and to extend the LED operating lifetime.

Although sapphire substrates enable high quality epitaxial layer growth, they are not electrically or thermally conductive and must be replaced with a good thermal conductor prior to final LED device packaging.

Various techniques have been proposed for substitution of sapphire with a thermally-conductive substrate. In one technique, laser lift-off is used to decompose an interface region of GaN using an excimer laser, permitting removal of the sapphire growth substrate. The laser lift-off method of removing sapphire substrates is disclosed in U.S. Pat. Nos. 6,455,340, 7,001,824 and 7,015,117. However, the current laser lift-off approach for making GaN light emitting diodes is incompatible with conventional semiconductor processes as it involves the use of expensive laser equipment. Further, laser lift-off can cause damage to the remaining semiconductor layers such as cracking.

In an alternative technique, chemical-mechanical polishing is used to remove the sapphire growth substrate following bonding of a new host substrate to the epitaxial material layer surface. Using chemical mechanical polishing (CMP), significant cost savings can be realized. Moreover, polishing is a milder method resulting in less damage than laser lift-off. However, the surface of the epitaxial material layer may be non-level due to various device processing prior to bonding of the new host substrate. When bonding a new substrate to a non-level surface, bonding gaps can occur, reducing bonding adhesion and/or causing stresses in the resulting device.

Thus, there is a need in the art for improved techniques for bonding new host substrates to epitaxial layers in LED device fabrication.

SUMMARY OF THE INVENTION

The present invention relates to methods for forming compound semiconductor LED devices, such as GaN-based LED devices. The invention uses some of the methods for the various process steps that are disclosed in US Published Patent Application Nos. 2009-0218590, 2008-0197367, 2011-0037051 and U.S. Pat. No. 7,846,753, the disclosures of which are incorporated by reference. In these applications and patents, sapphire is a material used for a host substrate on which compound semiconductor layers are fabricated.

In these commonly-assigned patents and applications, a growth substrate such as sapphire has GaN-including compound semiconductor epitaxial layers grown thereon such as InGaN. Typical thicknesses for the epitaxial layers are 3~10 microns and the growth substrate is approximately 430 microns.

Following mesa patterning, epitaxial layers are partially or completely removed in some areas where trenches are formed. Sequential dielectric and hard material layers are deposited and patterned. Diamond or diamond-like carbon are exemplary hard materials. The hard material serves as a polishing stop material during growth substrate removal process. Typical thickness for a hard material are 1~5 microns. The wafer surface becomes non-flat and the step height is >1 micron due to the existence of the hard material.

Thus, in order to bond a new host substrate to the resulting non-flat epitaxial layers, the present invention provides a metal layer that is deposited over the epitaxial layers, followed by planarization of the deposited metal layer. A new host substrate is bonded to the planarized metal layer and the first growth substrate is removed. Dicing is used to form individual LED devices.

BRIEF DESCRIPTION OF THE DRAWINGS

FIGS. 2A-2G depict a further method of forming a vertical LED according to an aspect of the present invention.

FIG. 2G' depicts a further vertical LED structure to an aspect of the present invention.

DETAILED DESCRIPTION

Figure 1A:
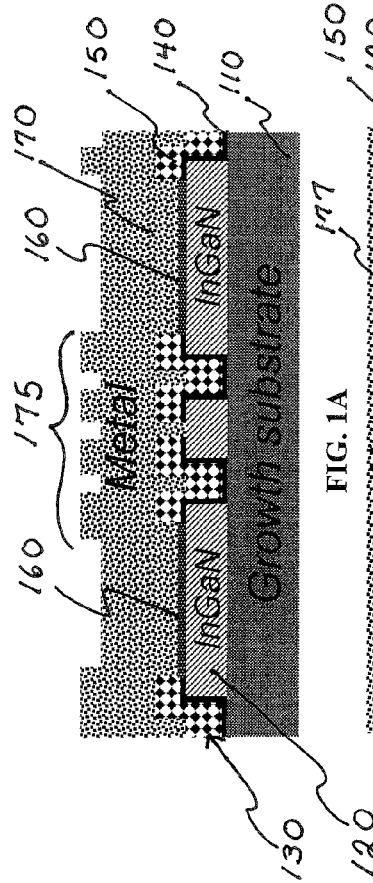
FIGS. 1A-1G depict a method of forming a vertical LED according to an aspect of the present invention.

According to the present invention, vertical LEDs are formed in which a metal layer deposited over epitaxially-formed semiconductor layer(s), particularly those that include GaN or compound semiconductor material including GaN, can be planarized prior to a new host substrate being bonded to the assembly. As used herein, the term "over" means that a layer is above another layer and is either directly in contact with that layer in one or more places or is separated from the lower layer by optional intermediate material layers. FIG. 1A depicts a portion of an entire wafer used to form plural LED dies which will eventually be finished into LED devices for incorporation into lighting fixtures or lighting elements. Only a few LED dies are depicted for ease of illustration. In FIG. 1A, a first substrate capable of supporting epitaxial growth 110 is provided. Exemplary substrate materials include sapphire, silicon, AlN, SiC, GaAs, and GaP although it is understood that any material capable of supporting the epitaxial growth of a subsequently-formed compound semiconductor material layer may be used as substrate 110. An epitaxial layer 120 of a compound semiconductor such as GaN or InGaN is formed on substrate 110. Although InGaN is depicted as an exemplary material, it is understood that other compound semiconductors such as InGaP, AlInGaN, AlInGaP, AlGaAs, GaAsP or InGaAsP, but not limited thereto, can also be used depending upon the overall desired color of the LED; thus the label "InGaN" in the drawings is merely used to represent such compound semiconductor layers. Although not shown in the drawings, various active layer structures can be included in layer 120 such as multiple quantum well (MQW) structures, n-doped and p-doped materials which may be the same or different as described in the previous patent applications incorporated by reference above. Note that FIG. 1A only shows a portion of a wafer that will eventually be separated into multiple individual LED devices. A typical wafer includes multiple dies formed on a large supporting substrate wafer so that numerous dies (which will eventually be fabricated into final devices) are simultaneously created.

Following formation of the starting material layers for a vertical LED, trenches 130 are formed in the multilayer structure 120 (shown already formed in FIG. 1A). Dry etching such as plasma etching and, particularly, inductively-coupled plasma etching, is selected for formation of trenches 130.

A passivation material layer 140 is shown formed in the trenches 130. The passivation material covers at least the trenches sidewalls and base. Selected passivation materials include dielectrics such as silicon oxides, silicon nitrides, etc. A hard material 150 which serves as polishing stop during a growth substrate removal process is formed over the passivation material and is patterned to expose the epitaxial semiconductor material. The hardness of the hard material is larger than that of the epitaxial semiconductor layers. Typical thickness for hard material 150 is 1~5 um.

In the embodiment of FIG. 1, a portion of the hard material covers at least a portion of the epitaxial semiconductor layer 120 forming a hard material "shoulder" over this region. As a result, as seen in FIG. 1A, the overall surface becomes non-flat and the step height is typically >1 micron due to the existence of the hard material film "shoulder". Hard material films can be selected from diamond, diamond-like carbon, carbides such as SiC, and nitrides such as boron nitride, but is not limited to these materials. Further description of the above process steps are found in the parent applications and patent, incorporated by reference above.

As seen in FIG. 1A, a metal layer 160 is selectively deposited over the semiconductor structure 120. The metal layer can serve as an electrical connection, for example, a p-electrode connection, and for optical reflection of light generated in the semiconductor layers. Typical metals include nickel, silver, titanium, aluminum, platinum, and alloys thereof, although any metal or other conductive material that can serve as an electrical connection and optical reflection can be used for layer 160 that is not incompatible with the selected epitaxial semiconductor material 120.

Covering the entire surface of the structure is a deposited metal layer 170. Typical metal deposition thickness is 10~100 microns. Because the substrate structure is not flat before metal deposition, the metal surface 175 is also not flat following deposition as seen by surface 175 in FIG. 1A. Preferably, the thermal conductivity of the deposited metal is higher than 130 W/m·K in order to effectively dissipate heat from the light-emitting semiconductor layer structure 120.

Figure 1B:
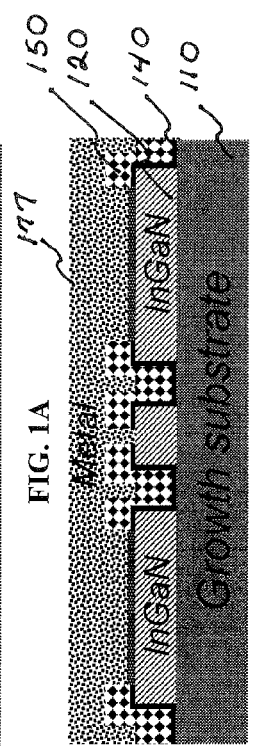

To prepare the metal layer 170 to bond to a new host substrate, the metal surface 175 is planarized to form new, flat metal layer surface 177 in FIG. 1B. Planarization can be selected from mechanical, chemical, chemical-mechanical, or thermal reflow planarization techniques. Typical final metal thickness is 1~80 microns. Metal thickness larger than 80 um is not optimal for using laser dicing techniques for LED chip separation. However, if other dicing techniques are used (e.g., mechanical sawing techniques), thicker metal layers are optionally selected. The new surface is then ready for a subsequent wafer bonding process.

Figure 1C:
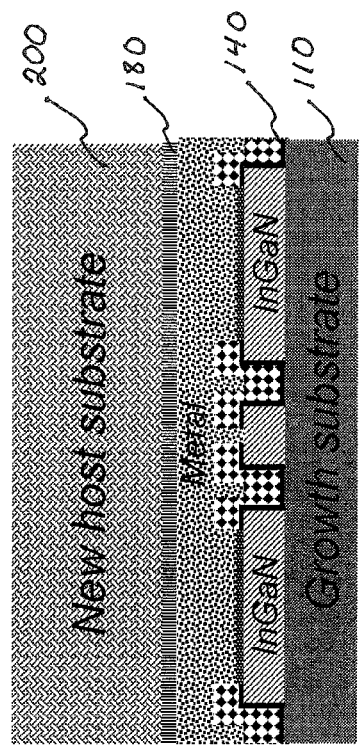

In FIG. 1C, a new host substrate 200 is bonded to the new surface 177 of metal layer 170 via a thin bonding layer 180. The new host substrate is typically a non-metal and highly thermally conductive material (thermal conductivity is higher than 130 W/m·K) such as SiC, AlN, silicon and other semiconductor materials; however, depending on the final application, a metal substrate can be selected. The new host substrate ideally possesses sufficient mechanical strength to adequately support the semiconductor material layer structure during subsequent processing and is easily diced by laser or mechanical dicing saw. The new host substrate has original thickness that is typically larger than 100 microns; however, the original thickness depends on the selected original overall dimensions. The bonding layer 180 may be a metal such as a metal solder or any other suitable permanent bonding material with good conductivity. Because the metal surface 177 is flat, no wafer cracking or bonding gaps will occur for bonded host substrate 200.

Figure 1D:
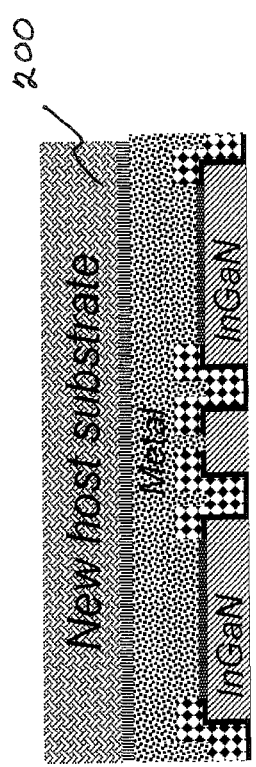

As seen in FIG. 1D, the new host substrate 200 is optionally thinned down through any conventional mechanical, chemical, or chemical mechanical thinning technique; however, depending on the original thickness of the new host substrate and the final desired thickness, thinning is not required. Typical final thickness of an individual device is 50~500 microns. The growth substrate 110 is then removed through a suitable technique such as polishing or chemical-mechanical polishing. At this point, the light-emitting semiconductor layer structure 120 has been successfully transferred from original growth substrate 110 to the new host substrate 200.

Figure 1E:
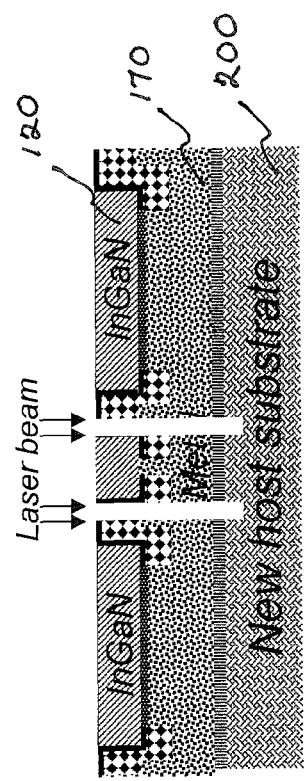
Figure 1F:
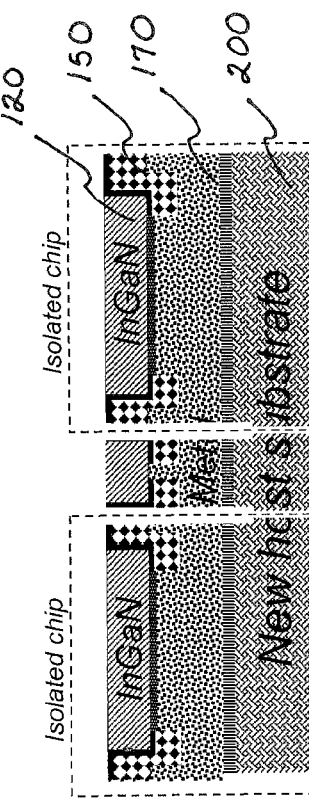

In FIG. 1E the orientation of the structure has been reversed ("flipped") with new host substrate 200 on the bottom and light-emitting semiconductor layer structure 120 on the top. To form individual devices, dicing is typically used to separate each LED. As seen in FIG. 1E, laser dicing is used for separation although any other technique for device separation can be used. Advantageously, laser dicing results in a narrow kerf width (down to 10 microns) in comparison to other separation techniques. When laser dicing is used, the laser cutting depth is on the order of the new host substrate 200 but complete laser separation is typically not necessary. As seen in FIG. 1F, using breaker elements 190 positioned under the new host substrate 200, LED devices can be isolated by mechanical cleaving.

Figure 1G:
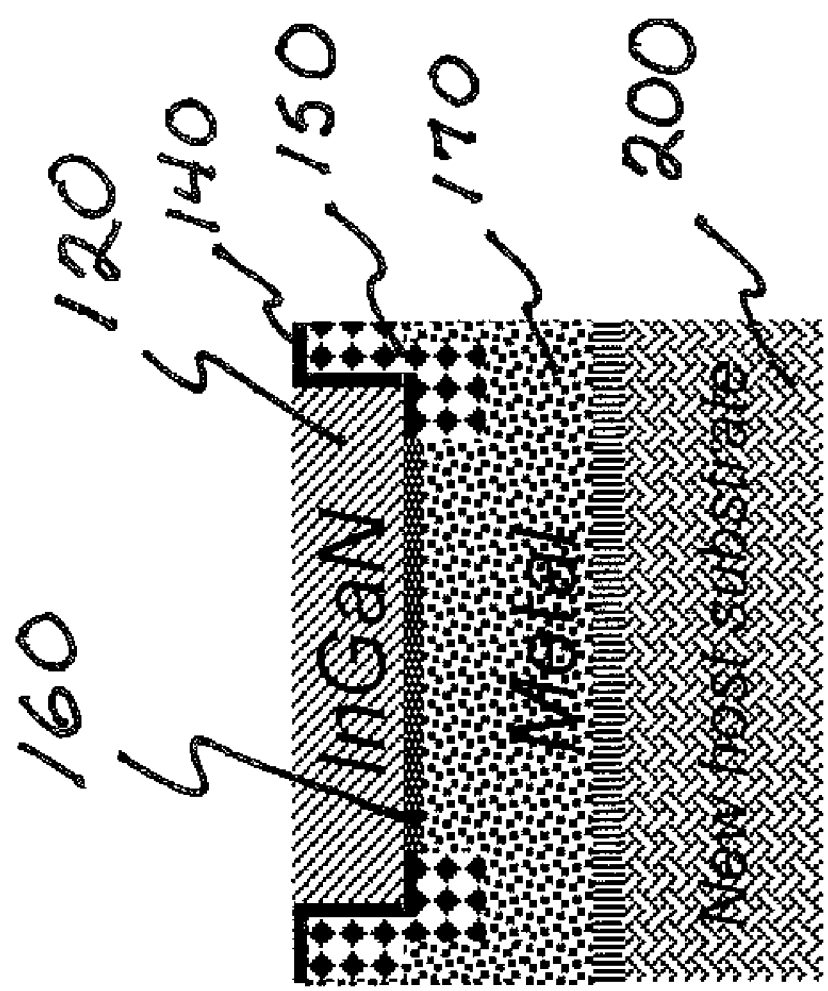

A separated device is shown in FIG. 1G. The semiconductor layer structure 120 includes InGaN epitaxial layers (3~10 microns). Optionally, the "shoulder" portion of the hard material 150 positioned at the surrounding area of the semiconductor layer structure 120 is retained after device separation. Layer 170 is the highly thermally conductive metal layer (1~80 microns, thermal conductivity >130 W/m·K) and element 200 is the new host substrate (50~150 microns).

FIGS. 2A-2G depict a further aspect of the present invention in which the hard material layer 150' is only deposited in trenches 130. The hard material may partially or completely fill trenches 130. Because the hard material 150' is not completely co-planar with the semiconductor material 120, an uneven surface is still present following deposition of metal layer 170 and planarization is still desirable.

Figure 2A:
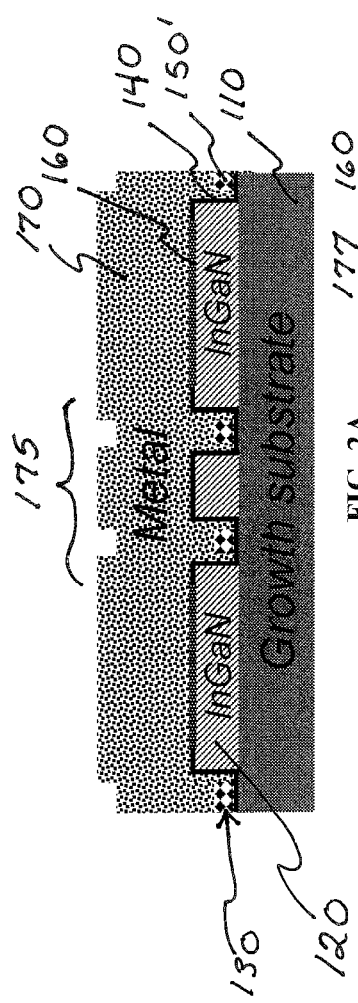
Figure 2B:
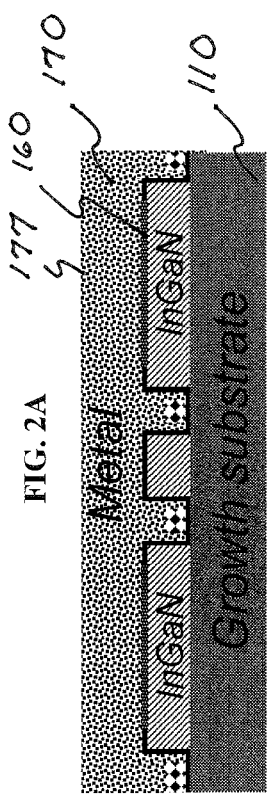
Figure 2C:
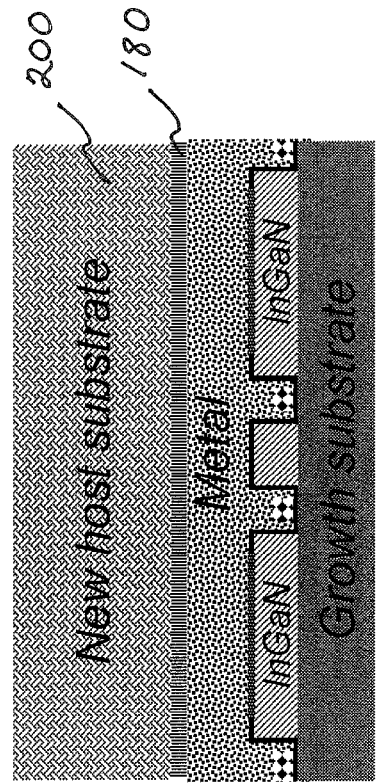
Figure 2G:
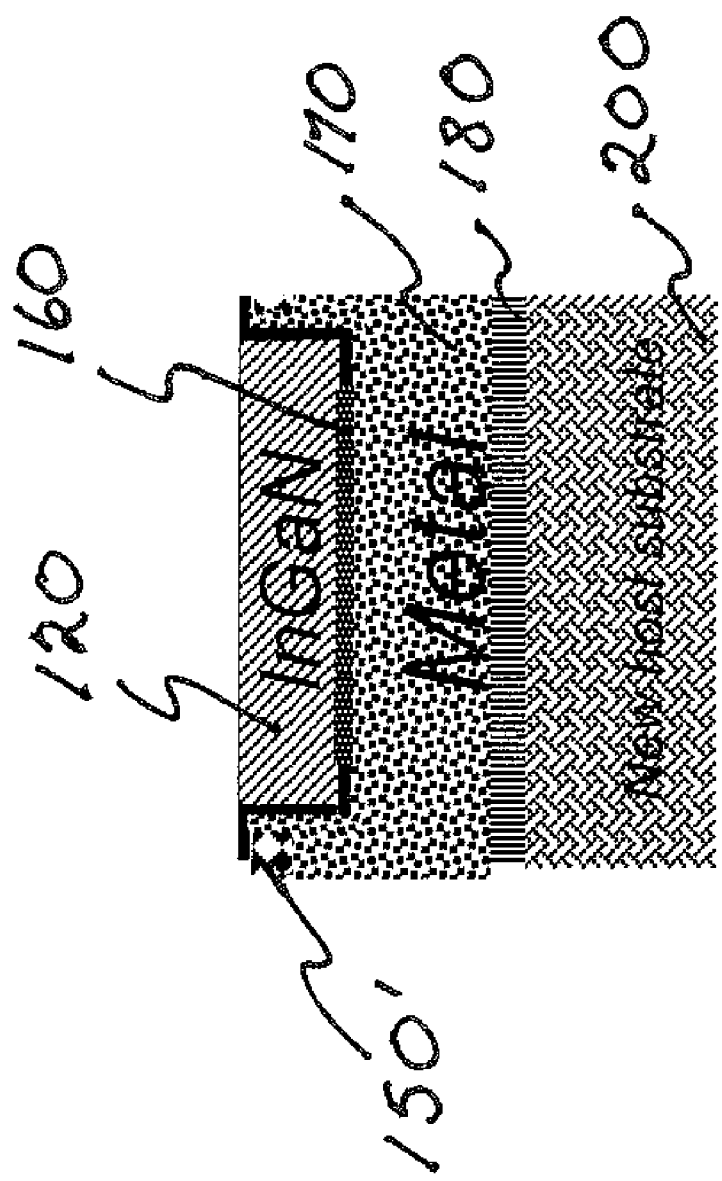
Figure 2G:
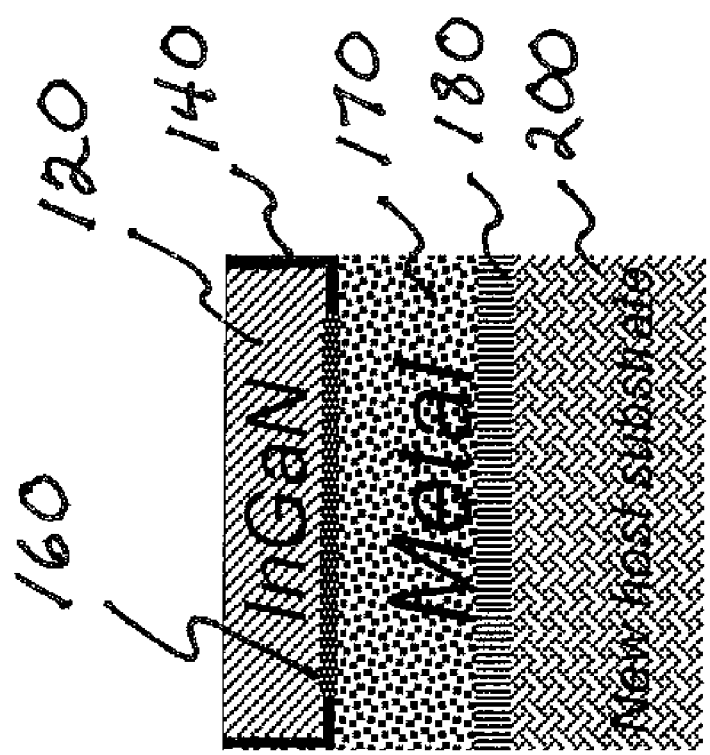

In FIG. 2G', hard material 150' has been removed through any conventional technique or through the choice of the separation location (such that the hard material 150' during device separation). In this manner, passivation material 140 forms the outer edge around the semiconductor material 120.

Following separation into individual devices, the vertical LEDs are packaged and incorporated into LED light fixtures.

Packaging can include addition of various phosphors or other compounds to change the perceived color of the emitted LED light.

While the foregoing invention has been described with respect to various embodiments, such embodiments are not limiting. Numerous variations and modifications would be understood by those of ordinary skill in the art. Such variations and modifications are considered to be included within the scope of the following claims.

The invention claimed is:

1. A method of fabricating a plurality of compound semiconductor vertical light emitting diode dies including compound semiconductor epitaxial layers with one or more layers of nitride-based compound semiconductor material, and bonding a new host substrate to the compound semiconductor vertical light emitting diode, the method comprising:
   providing a first growth substrate capable of supporting compound semiconductor epitaxial growth thereon;
   forming one or more epitaxial layers of compound semiconductor material on the first growth substrate;
   creating one or more trenches in at least a portion of the compound semiconductor material;
   depositing a passivating material in one or more trenches;
   depositing a hard material at least partially in the one or more trenches, the hard material having a hardness greater than the hardness of the compound semiconductor material;
   depositing a highly thermally conductive metal layer over the compound semiconductor material;
   planarizing the deposited metal layer to form a substantially flat metal layer for subsequent new host substrate bonding;
   bonding the new host substrate to the metal layer, the new host substrate being highly thermally conductive; and
   removing the first growth substrate.

2. A method of fabricating a plurality of compound semiconductor vertical light emitting diode dies according to claim 1 wherein the hard material is additionally deposited on at least a portion of the compound semiconductor material to form a shoulder of hard material on the compound semiconductor material.

3. A method of fabricating a plurality of compound semiconductor vertical light emitting diode dies according to claim 1 further comprising selectively depositing metal layers over at least a portion of the compound semiconductor material, the metal layers forming electrodes, optical reflectors, or both.

4. A method of fabricating a plurality of compound semiconductor vertical light emitting diode dies according to claim 1 further comprising depositing a bonding metal between the planarized metal layer and the new host substrate and wherein the new host substrate is a non-metal material.

5. A method of fabricating a plurality of compound semiconductor vertical light emitting diode dies according to claim 1 wherein the hard material is diamond, diamond-like carbon, boron nitride or silicon carbide.

6. A method of fabricating a plurality of compound semiconductor vertical light emitting diode dies according to claim 1 wherein the growth substrate is removed by polishing or chemical-mechanical polishing.

7. A method of fabricating a plurality of compound semiconductor vertical light emitting diode dies according to claim 1 further comprising device separation to form individual light emitting diodes.

8. A method of fabricating a plurality of compound semiconductor vertical light emitting diode dies according to claim 7 wherein the device separation is laser dicing.

9. A method of fabricating a plurality of compound semiconductor vertical light emitting diode dies according to claim 1 wherein at least one of the compound semiconductor epitaxial layers includes GaN or InGaN.

10. A method of forming lighting elements incorporating compound semiconductor vertical light emitting diodes comprising packaging the separated devices of claim 7.

11. Compound semiconductor vertical light emitting diode structures including compound semiconductor epitaxial layers with one or more layers of nitride-based compound semiconductor material bonded to a new host substrate, comprising:
   one or more epitaxial layers of compound semiconductor material forming a portion of a vertical light emitting diode;
   one or more trenches formed in at least a portion of the compound semiconductor material creating plural dies within the compound semiconductor material;
   a passivating material layer deposited in the one or more trenches;
   a hard material at least partially deposited in the one or more trenches, the hard material having a hardness greater than the hardness of the compound semiconductor material;
   a highly thermally conductive planarized metal layer deposited over the compound semiconductor material, the metal layer having a thermal conductivity greater than 130 W/m·K and a thickness of approximately 1-80 microns;
   an adhesion layer positioned over the planarized metal layer; and
   a new highly thermally conductive host substrate bonded to the planarized metal layer via the adhesion layer and having a thickness of approximately 50-500 microns.

12. Compound semiconductor vertical light emitting diode structures according to claim 11 wherein the hard material is additionally positioned on at least a portion of the compound semiconductor material.

13. Compound semiconductor vertical light emitting diode structures according to claim 11 further comprising selectively deposited metal layers positioned over at least a portion of the compound semiconductor material, the metal layers forming electrodes, optical reflectors, or both.

14. Compound semiconductor vertical light emitting diode structures according to claim 11 wherein the hard material is diamond, diamond-like carbon, boron nitride, or silicon carbide.

15. Compound semiconductor vertical light emitting diode structures according to claim 11 wherein at least one of the compound semiconductor epitaxial layers includes GaN or InGaN complex compound materials.

16. A semiconductor vertical light emitting diode separated from the structure of claim 11 through the trenches such that the hard material remains along the sidewall of compound semiconductor layers.

17. A semiconductor vertical light emitting diode according to claim 16 wherein the hard material has been removed from regions adjacent the compound semiconductor material.

18. A lighting element including a packaged vertical light emitting diode of claim 16.

* * * * *